US006615680B1

(12) United States Patent
Dahlstrom et al.

(10) Patent No.: US 6,615,680 B1
(45) Date of Patent: Sep. 9, 2003

(54) METHOD OF TESTING SWITCH DESIGN TO QUANTIFY FEEL

(75) Inventors: Jonathan Dahlstrom, Highland, MI (US); Donald E. Ellison, Mt. Clemens, MI (US); Richard Ratke, Dearborn, MI (US)

(73) Assignee: Lear Automotive Dearborn, Inc., Southfield, MI (US)

( * ) Notice: Subject to any disclaimer, the term of this patent is extended or adjusted under 35 U.S.C. 154(b) by 0 days.

(21) Appl. No.: 08/780,204

(22) Filed: Jan. 8, 1997

(51) Int. Cl.[7] .................... G01M 19/00; G01R 31/327; G01L 5/22

(52) U.S. Cl. .................... 73/865.9; 73/862.01; 324/415

(58) Field of Search .......................... 73/865.9, 862.01; 324/537, 764, 538, 415, 418, 421, 424

(56) References Cited

U.S. PATENT DOCUMENTS 2,104,629 A * 1/1938 Wilheim .................... 324/424
3,685,347 A * 8/1972 Hildebrant et al. ........ 73/35.16
4,455,860 A * 6/1984 Cullick et al. ......... 73/61.47 X
4,658,372 A * 4/1987 Witkin ........................ 702/73
5,023,791 A * 6/1991 Herzberg et al. ...... 324/73.1 X
5,130,506 A * 7/1992 Zuercher et al. ............ 200/553
5,141,329 A * 8/1992 Orlando et al. ......... 702/136 X
5,434,566 A * 7/1995 Iwasa et al. .................. 341/34

OTHER PUBLICATIONS

*Calculus and Analytic Geometry* , 2nd Edition John A. Tierney Pub. 1972 (Month not Given) pp. 179–185.*
Patent Abstract of Japan; Publication No.: 06169241; Publication Date: Jul. 6, 1994; Title "Developing System for Realizing Optimal Operational Feeling".

* cited by examiner

*Primary Examiner*—Thomas P. Noland
(74) *Attorney, Agent, or Firm*—Bill C. Panagos; MacMillan, Sobanski & Todd, LLC

(57) ABSTRACT

A method of testing a switch looks at the second derivative of the resistance force to movement. The second derivative is most indicative of the feel the operator will experience when utilizing the switch. It is desirable to keep the second derivative to a minimum for the switch at locations other than end of travel or detent positions. By investigating the second derivative, one is provided with feedback of areas on the switch that might require further investigation or re-evaluation.

7 Claims, 4 Drawing Sheets

METHOD OF TESTING SWITCH DESIGN TO QUANTIFY FEEL

BACKGROUND OF THE INVENTION

This invention relates to a unique way of testing a switch to determine whether the switch will provide a desired feel to an operator.

Switches are utilized in many control functions. Various types of switches are moved by an operator between any one of several positions to terminate or begin operation of a system, component, etc. Switches are tested to insure that they do not present unduly high resistance to an operator. That is, it is not desirable to have a switch that is difficult to move.

FIG. 1 graphically illustrates the typical testing that has been performed on a switch design. The force resistance of the switch is plotted with respect to the movement of the switch. Typically, a switch has greater forces as it approaches an end of travel or detent position. Historically, switch designers have looked only to the magnitude of the force. As an example, FIG. 1 shows an example of two switch tests which plot the resistance force against movement of the switch. A graph 20 includes acceptable envelope boundaries 22 and 24 which are plotted onto the force versus movement graph 20. In the prior art, a switch design is found unacceptable if the force should cross the boundaries. Thus, a first switch design with test results 26 would be found acceptable since the plot is within the boundaries 22 and 24 throughout its range. Note that the graph 26 has extreme low points 28 and high points 30, and fluctuates repeatedly between those points.

In fact, while this switch design would be found acceptable, the feel might well be undesirable to an operator. The rapidly fluctuating force would make it difficult for an operator to determine end of travel, or whether the switch has been moved sufficiently to a particular position. Moreover, such rapidly fluctuating resistance force is typically not found to provide a good feel to the operator.

A second plot 32 is also shown in the graph 20. Plot 32 represents a second switch test, and does not have the rapid fluctuations of the plot 26. However, there is an extreme high point 34 in plot 32. In fact, plot 32 moves gradually upwardly to the high point 34 and then decreases gradually again. Using the prior art switch testing methods, the plot 32 would be found to indicate the associated switch was unacceptable. The high point 34 is outside of the boundary 24, and thus this switch would be rejected or reworked.

In fact, most operators might well find the switch shown by the plot 32 to feel better than the switch shown by plot 26. Rapid fluctuations, outside detent or end of travel positions, are much less desirable than a gradual change. Thus, the prior art type testing illustrated in FIG. 1 does not provide fully accurate information of a switch feel.

One prior art attempt to address this problem is illustrated in FIG. 2. FIG. 2 shows a second graph 36 having force boundaries 38 and 40 which are much closer than those shown in FIG. 1. A plot 42 for a switch must fall within the boundary 38 or 40 or the switch will be found unacceptable. By making the boundaries 38 and 40 quite close, the switch designers hope to minimize fluctuation. Even so, some fluctuation still exists. Moreover, by making such tight boundaries, otherwise acceptable feeling switches are labeled unacceptable.

SUMMARY OF THE INVENTION

In a disclosed embodiment of this invention, a method of testing a switch focuses on the “feel” to the operator by looking at how the resistance force changes with movement. The present invention has determined that the most relevant factor to an operator’s feel is whether the change in resistance force is gradual, like plot 32, or extreme, like plot 26. Thus, the present invention plots the resistance force against movement of the switch, and then looks at the second derivative of that plot. It is desirable to keep the second derivative as close to zero as possible, except at detents or end of travel positions to provide a smooth, well-defined feel.

In the disclosed embodiment of this invention, the present invention uses an upper and lower acceptable limit to the second derivative plot. If that second derivative plot crosses one of the limits, then the switch is found unacceptable in the region where the second derivative has crossed the limits. It is typical that the second derivative will have spikes at detents or end of travel position. According to the present invention, a second derivative spike wherein the second derivative plot moves far from zero at a location other than the end of travel or detent that could provide an undesirable feel. If the problem occurs with a design being tested, a designer may wish to reevaluate the design. If the problem occurs during production quality control then the switch may be discarded as the production line may be checked.

These and other features of the present invention can be best understood from the following specification and drawings, of which the following is a brief description.

DETAILED DESCRIPTION OF PREFERRED EMBODIMENT

Figure 1:
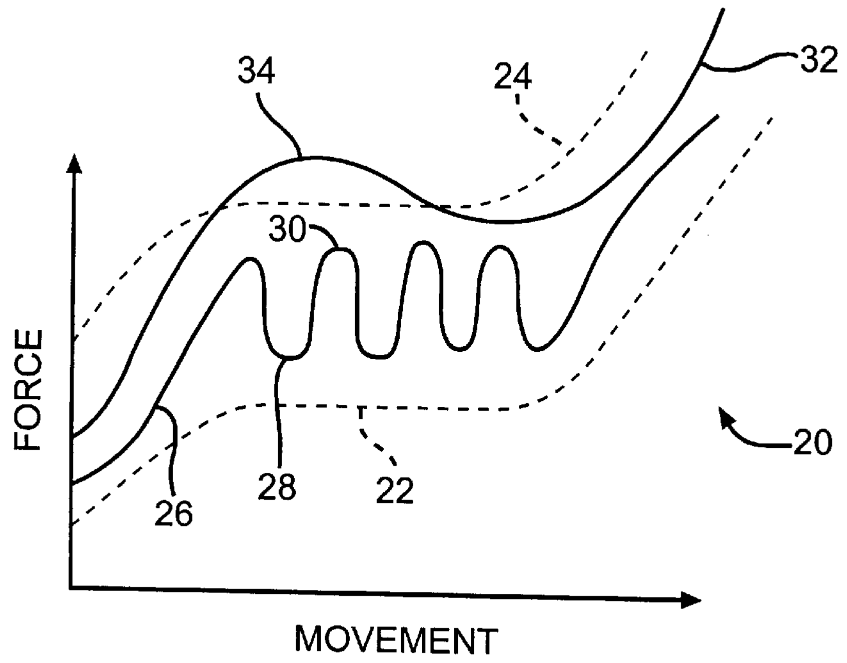
FIG. 1 (PRIOR ART)
FIG. 1 is a graph of a prior art method of testing a switch.
Figure 2:
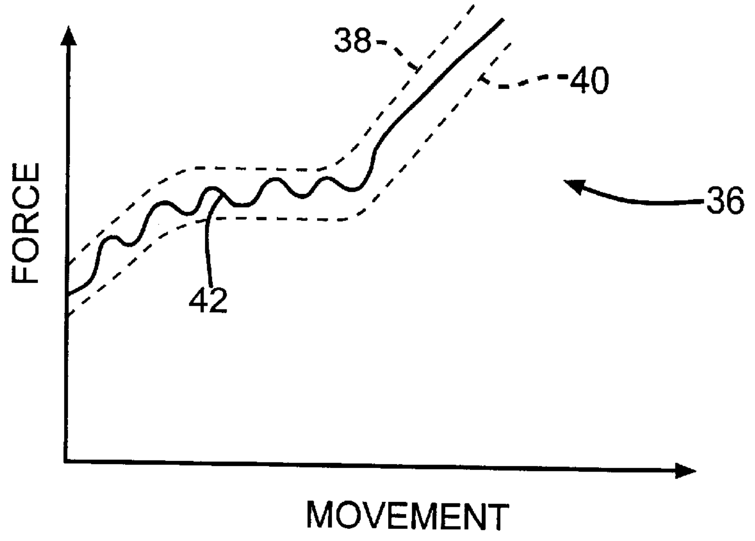
FIG. 2 (PRIOR ART)
FIG. 2 graphically shows a second prior art method of testing a switch.
Figure 3:
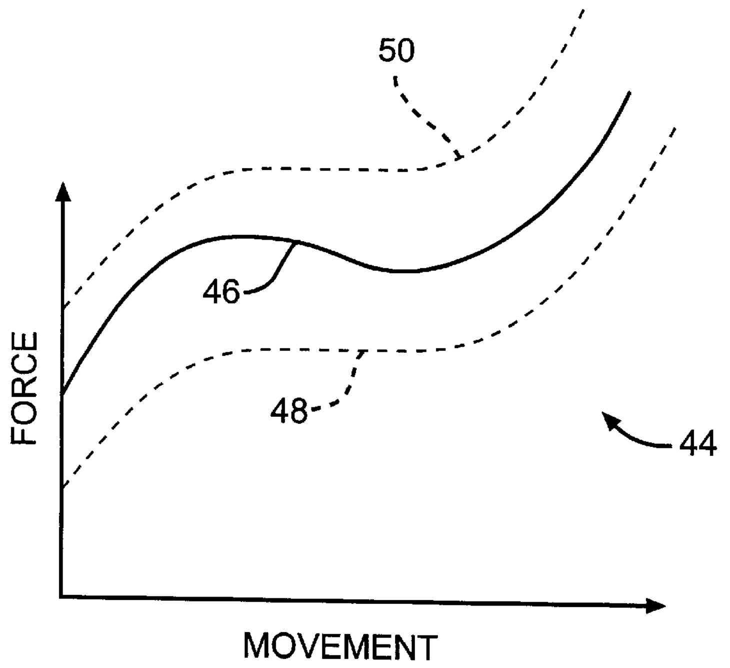
FIG. 3 graphically shows a preferred switch.

The present invention realizes that a smooth switch design is not necessarily provided by the type of testing shown in FIGS. 1 or 2. FIG. 3 shows a preferred switch force versus movement plot 44. The present invention recognizes that the switch plot 46 would be a smooth slope with few or no sharp changes in the resistance force. Using the present invention allows boundaries 48 and 45 for the force to be relatively great, yet force fluctuations are minimized or eliminated. Even so, by recognizing that the goal should be to minimize rapid changes in the resistance force, as opposed to looking only to control the magnitude of the resistance force, the present invention results in switches that do provide the type of feel desired by most switch operators.

Figure 4:
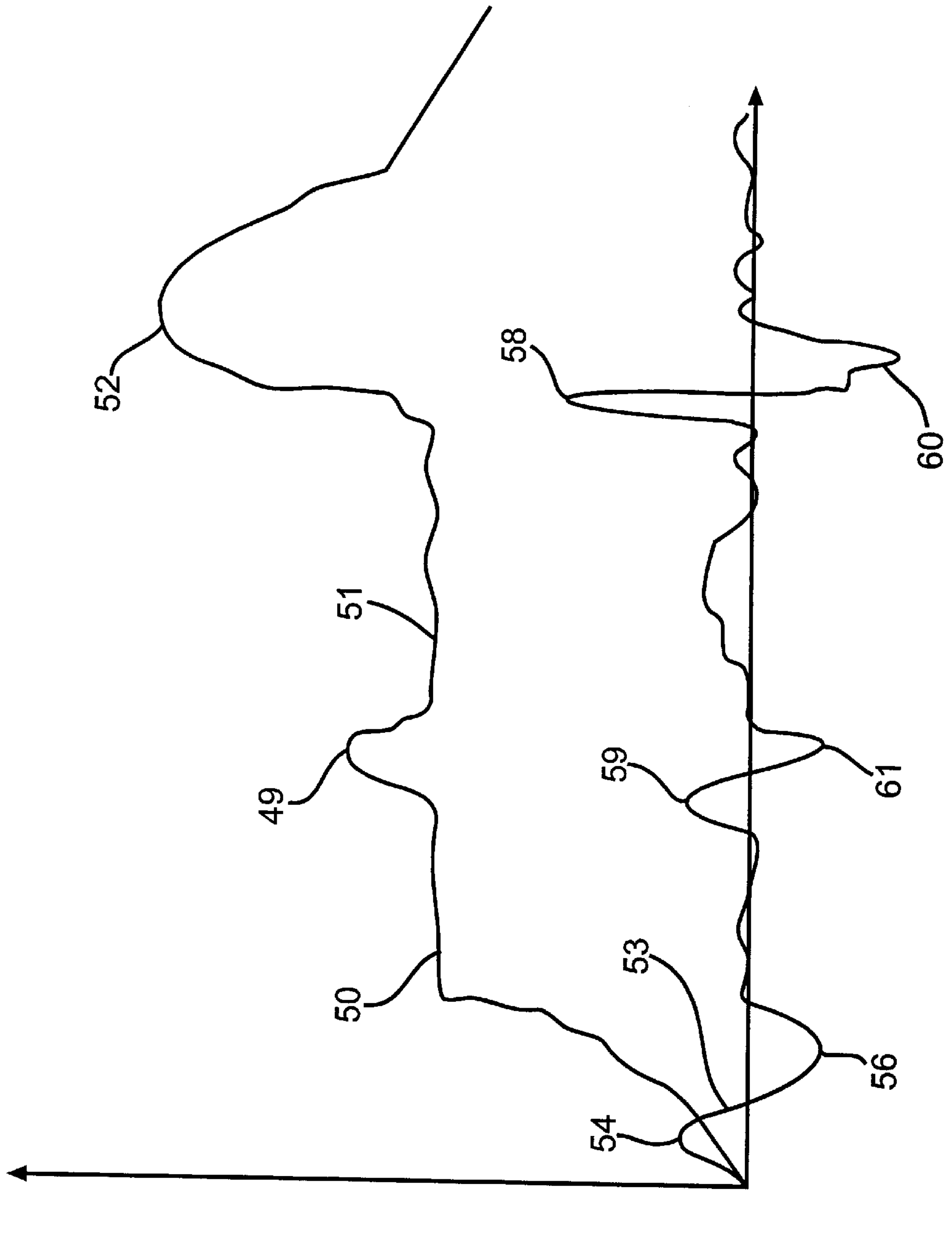
FIG. 4 is a graph utilized by the present invention.

FIG. 4 shows a force versus movement plot 50 for a switch. As shown, the plot 50 increases rapidly upwardly to a plateau 51. Plateau 51 includes a sharp upward movement 49, which may be caused by internal switch components contacting each other at their location, or other conditions in the switch. Soon after plateau 51, the resistance force moves to a spike 52 increasing rapidly to the uppermost part of the spike 52, and then decreasing rapidly.

Plot 53 shows the second derivative of the plot 50. As shown, there might be a slight upward spike 54 in the second derivative followed by a rapid decline to a low point 56. During the plateau 51, the second derivative fluctuates around the zero line. As the force begins moving towards the spike 52 there is a high point 58 in the second derivative plot followed by a low point 60. The upward movement 49 results in spikes 59 and 61.

The present invention recognizes that in utilizing the switch represented by the plots 50 and 53, the most notable or significant portions of the movement to an operator's feel are the spikes 54, 56, 58 and 60. It would be desirable to have spikes in the second derivative only at end of travel or detent positions. Thus, spike 54, 56, 58 and 60, which occur during the beginning or end of travel may be acceptable. However, spikes 59 and 61 occur during the plateau portion 51. These changes could be interpreted by an operator as indicating an end of travel or detent position has been reached. This would be undesirable. If testing a design, the switch designer might wish to investigate why a spike would occur during a desired plateau portion. Alternatively, in a quality check this provides feedback on a particular switch from a production line.

Figure 5:
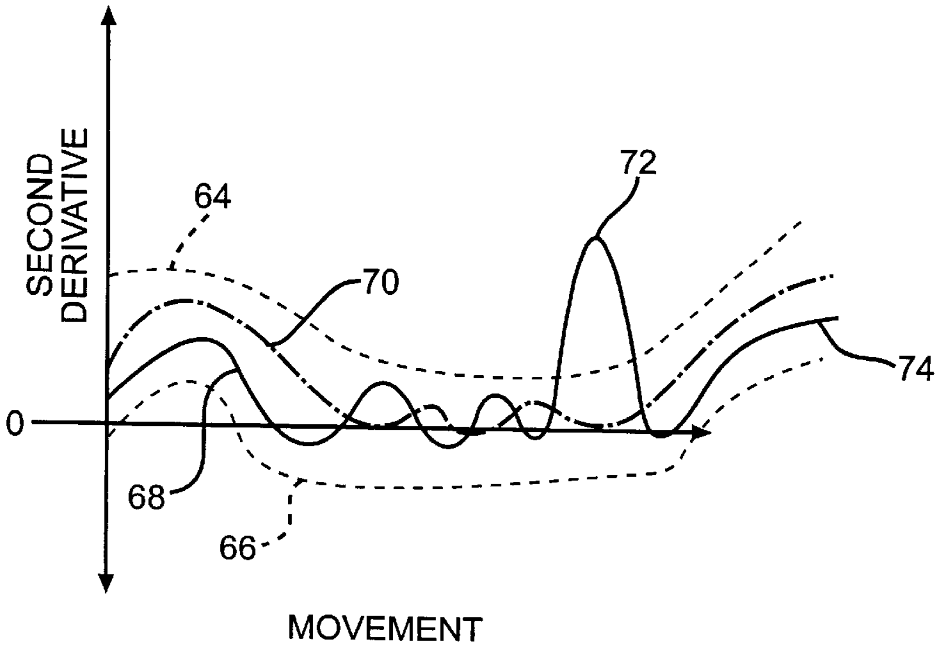
FIG. 5 shows a second graph utilized by the present invention.

FIG. 5 shows two second derivative plots compared to boundaries for the second derivative. As shown, the graph 62 includes an upper boundary 64 and a lower boundary 66 for the second derivative. If the second derivative of the force versus movement for the switch falls within these boundaries, then the switch is of an acceptable feel to operator. As shown, the second derivative plot 68 of a first switch has a relatively high spike at its initial travel portion, another spike 72 near the middle of travel portion and a third spike 74 near end of travel portion. As shown, the boundary 64 accommodates spikes at beginning and end of travel. This anticipates the spike that would naturally occur at the end of travel positions. The switch designer would want to investigate the location of spike 72, however, because this might indicate some undesirable change in the resistance force in an area where one would desire no such change. Plot 70 shows the second derivative of a more acceptable switch wherein the spikes for the plot are all within the boundaries 64 and 66.

Figure 6:
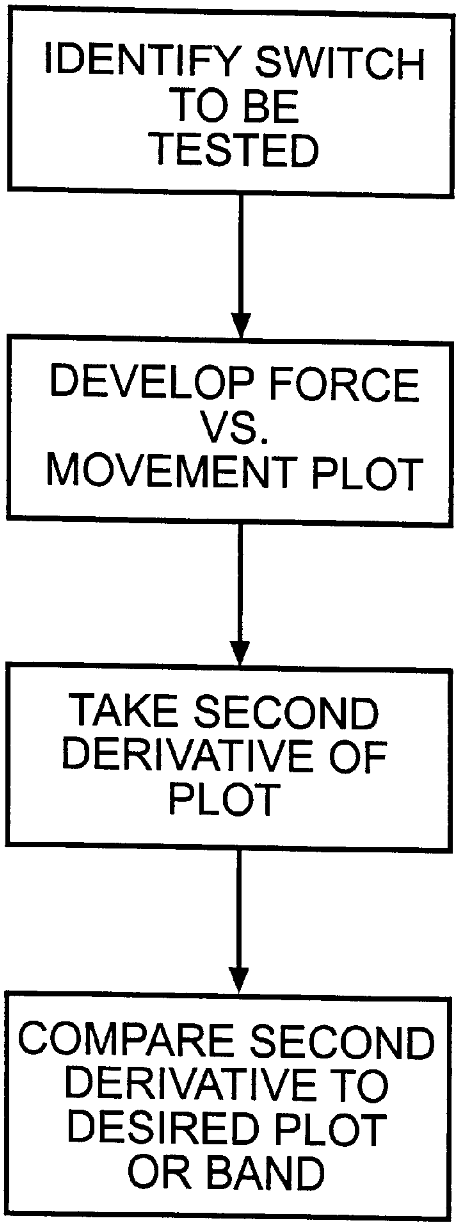
FIG. 6 is a flow chart of the present inventive method.

FIG. 6 is a basic flow chart showing the operative steps in testing a switch according to the present invention. The first step is to identify a switch to test. One then develops a force versus movement plot of the resistance force. This can be done electronically with a prototype switch. Alternatively, it may be possible to predict the resistance force using computer simulation for certain switches. At any rate, a plot of the resistance force during movement of the switch is developed. Next, one takes the second derivative of that resistance force with movement. This type of calculation may be done by known computer programs.

The switch designer then compares the second derivative plot to look for spikes at locations where no spikes are desired. The switch designer may develop an acceptable boundary or envelope for the second derivative, and look for spikes that move outwardly of that boundary. Alternatively, it may be that one simply looks for spikes in an area where there should be no spikes. If the second derivative shows an acceptable switch, then one may be comfortable that the switch will have an acceptable feel to an operator.

It should be understood that the graphs utilized in this invention are greatly simplified from those which are typically experienced in a real switch application. The graphs have been simplified to better illustrate the main concepts of this invention.

Preferred embodiments of this invention have been disclosed, however, a worker of ordinary skill in the art would recognize that certain modifications would come within the scope of this invention. For that reason, the following claims should be studied to determine the true scope and content of this invention.

What is claimed is:

1. A method of testing a switch comprising the steps of:

(1) identifying a switch to test;

(2) developing a plot of the second derivative of resistance force to movement for said switch; and (3) investigating spikes in said second derivative plot.

2. A method as recited in claim 1, wherein said identified switch of step (1) is a new switch design.

3. A method as recited in claim 2, wherein said design is investigated if a spike is found in step (3) at a location where no spike is desired.

4. A method as recited in claim 1, further including step (3) including the sub-step of defining upper and lower boundaries for said second derivative, and identifying any second derivative crossings of said boundaries as an undesirable spike.

5. A method as set forth in claim 1, wherein said second derivative plot is developed by first developing a plot of resistance force versus movement, then taking the second derivative of that plot.

6. A method as set forth in claim 1, wherein said identified switch is a production switch being tested as a quality check.

7. A method of testing a switch comprising the steps of:

(1) identifying a switch to be tested which is movable between first and second positions;

(2) developing a plot of resistance force versus movement as said switch moves between said first and second positions;

(3) taking the second derivative of said plot of said resistance force as said switch moves between said first and second positions; and (4) investigating spikes in said second derivative plot.

* * * * *